United States Patent [19]
Mulbrook

[11] Patent Number: 5,587,688
[45] Date of Patent: Dec. 24, 1996

[54] DIFFERENTIAL AUTOMATIC GAIN-CONTROL AMPLIFIER HAVING AN ENHANCED RANGE

[75] Inventor: Mark M. Mulbrook, Marion, Iowa

[73] Assignee: Rockwell International Corp., Seal Beach, Calif.

[21] Appl. No.: 551,358

[22] Filed: Nov. 1, 1995

Related U.S. Application Data

[63] Continuation of Ser. No. 331,833, Oct. 31, 1994, abandoned.

[51] Int. Cl.$^6$ ................................................ H03F 3/45
[52] U.S. Cl. ........................................ 330/253; 330/254
[58] Field of Search ................................ 330/252, 253, 330/254, 261, 277

[56] References Cited

U.S. PATENT DOCUMENTS

| | | | |
|---|---|---|---|
| 3,560,866 | 2/1971 | Haines | 330/27 |
| 3,684,974 | 8/1972 | Solomon et al. | 330/30 |
| 4,069,431 | 1/1978 | Kucharewski | 307/355 |
| 4,227,256 | 10/1980 | O'Keefe | 455/251 |
| 4,459,555 | 7/1984 | Jett, Jr. | 330/253 |
| 4,520,324 | 5/1985 | Jett, Jr. et al. | 330/285 |
| 4,536,717 | 8/1985 | Hauge et al. | 330/254 |
| 4,621,238 | 11/1986 | Fenk | 330/254 |
| 4,864,248 | 9/1989 | Jansen | 330/254 |
| 5,061,901 | 10/1991 | Nicollini et al. | 330/253 |

*Primary Examiner*—Steven Mottola
*Attorney, Agent, or Firm*—Kyle Eppele; M. Lee Murrah; G. A. Montanye

[57] ABSTRACT

An enhanced differential amplifier circuit includes an injected inverted signal to the differential amplifier. As the AGC amplifier attenuates, the inverted signal becomes increasingly significant in the total gain ratio, thereby extending its operating range. Both a single current source and dual source implementation are disclosed.

2 Claims, 3 Drawing Sheets

DIFFERENTIAL AUTOMATIC GAIN-CONTROL AMPLIFIER HAVING AN ENHANCED RANGE

This Application is a Continuation of application Ser. No. 08/331,833 filed Oct. 31, 1994, now abandoned.

BACKGROUND OF THE INVENTION

This invention relates generally to differential amplifiers, and, more particularly, to a new enhanced automatic gain-control (AGC) amplifier having an extended operating range over prior art devices.

Electronic gain-control in prior art solid-state amplifiers have varied applications and operating techniques, depending upon design choice and functional demands. Of the devices that implement bi-polar amplifiers, most vary the current to control gain. Alternatively, differential amplifiers typically control gain by changing the source degradation resistance. Devices of either type tend to be limited to a narrow predefined operating frequency and consume, proportional to output, sizable amounts of power.

Accordingly, there exists a need for an AGC amplifier operable over a wide frequency band and having an enhanced gain range.

SUMMARY OF THE INVENTION

The object of the present invention is to provide a differential amplifier having increased AGC and minimal gain.

Yet another object of the present invention is to provide an AGC amplifier having minimal power requirements.

A feature of the present invention is an amplifier stage having two pairs of transistors differentially coupled.

An advantage of the present invention is the simplified construction of an AGC amplifier operable over a wide frequency band.

An amplifier stage comprised of two pairs of transistors differentially coupled receives an inverted signal at each pair of differential transistors. The value of the inverted signal is independent of the attenuation of the amplifier. As attenuation occurs, the constant gain of the inverted signal becomes the controlling factor for enhancing the controllable gain attenuation of the amplifier stage.

DETAILED DESCRIPTION OF THE SPECIFIC EMBODIMENTS

Figure 1:
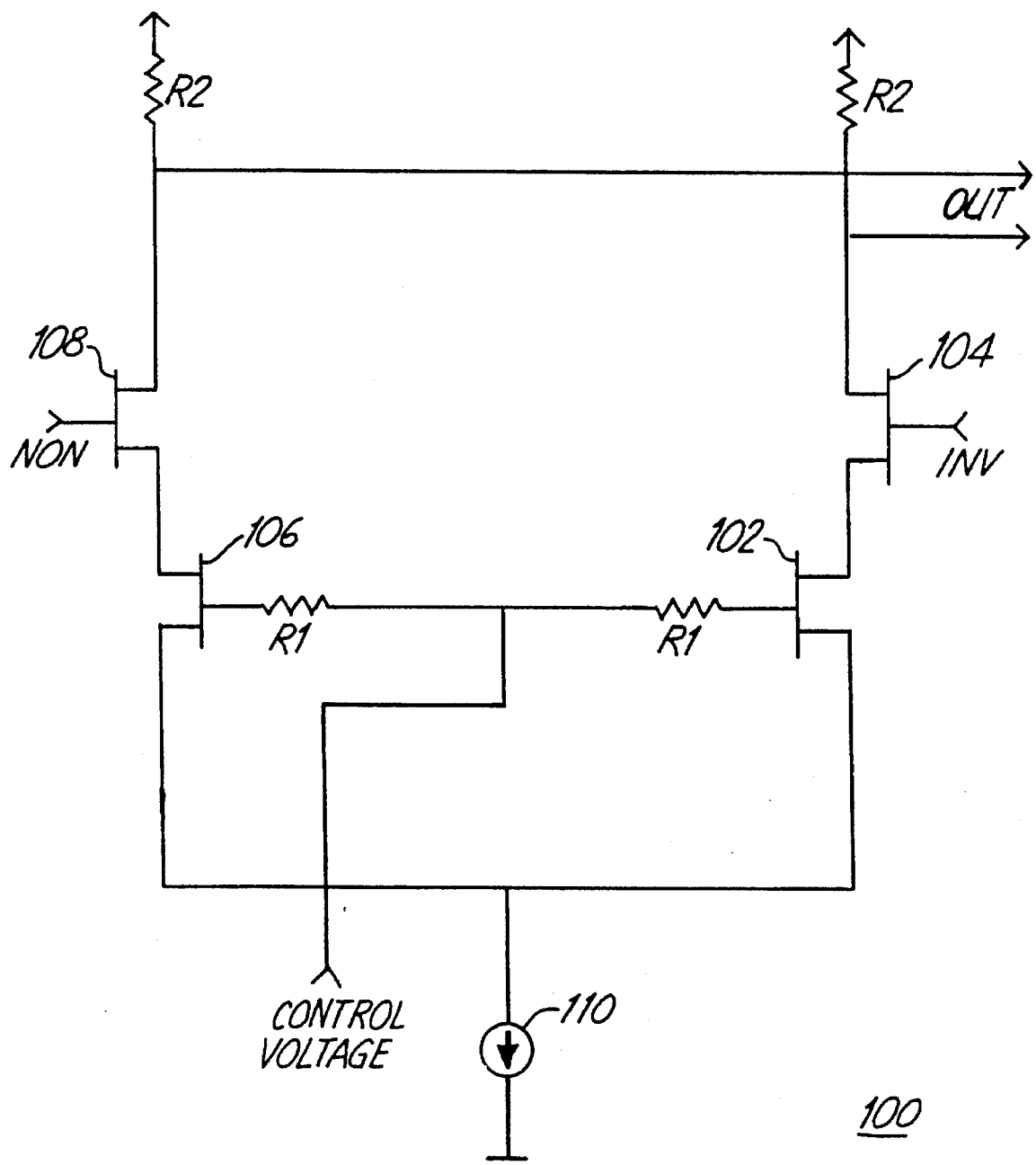
FIG. 1 is a schematic diagram of a gain control differential amplifier stage, as known in the prior art.

Referring now to the drawings, wherein like items are referenced as such throughout, FIG. 1 illustrates a single stage AGC differential amplifier 100, as known in the prior art. A first and second pair of transistors 102, 104 and 106, 108 are electrically coupled, drain-to-source, in parallel fashion, to a current source 110. A control voltage is electrically coupled to the gate of transistors 102, 106. The output signals of drain electrodes of transistors 104, 108 provide the gain stage of the amplifier 100 with resistors $R_2$ serving as the load. A pair of resistors R, are disposed between the gate electrodes of the transistors 102, 106 for circuit stability. The voltage controlled transistors 102, 106 vary in resistance, thereby providing signal source degradation to pair amplifier transistors 104, 108. This effectively lowers the gain of the amplifier 100 as a function of the control voltage.

The single stage amplification provided by the device 100 is traditionally coupled in series to additional stages of similar composition, thereby providing a desired functionality by altering the number of stages invoked in the particular design. A disadvantage of the coupled in series apparatus of FIG. 1 is the introduction of gain, as provided by the summation of gain by each stage. Additionally, the utilization of the numerous components required to construct each amplifier stage raise reliability and power consumption concerns.

Figure 2:
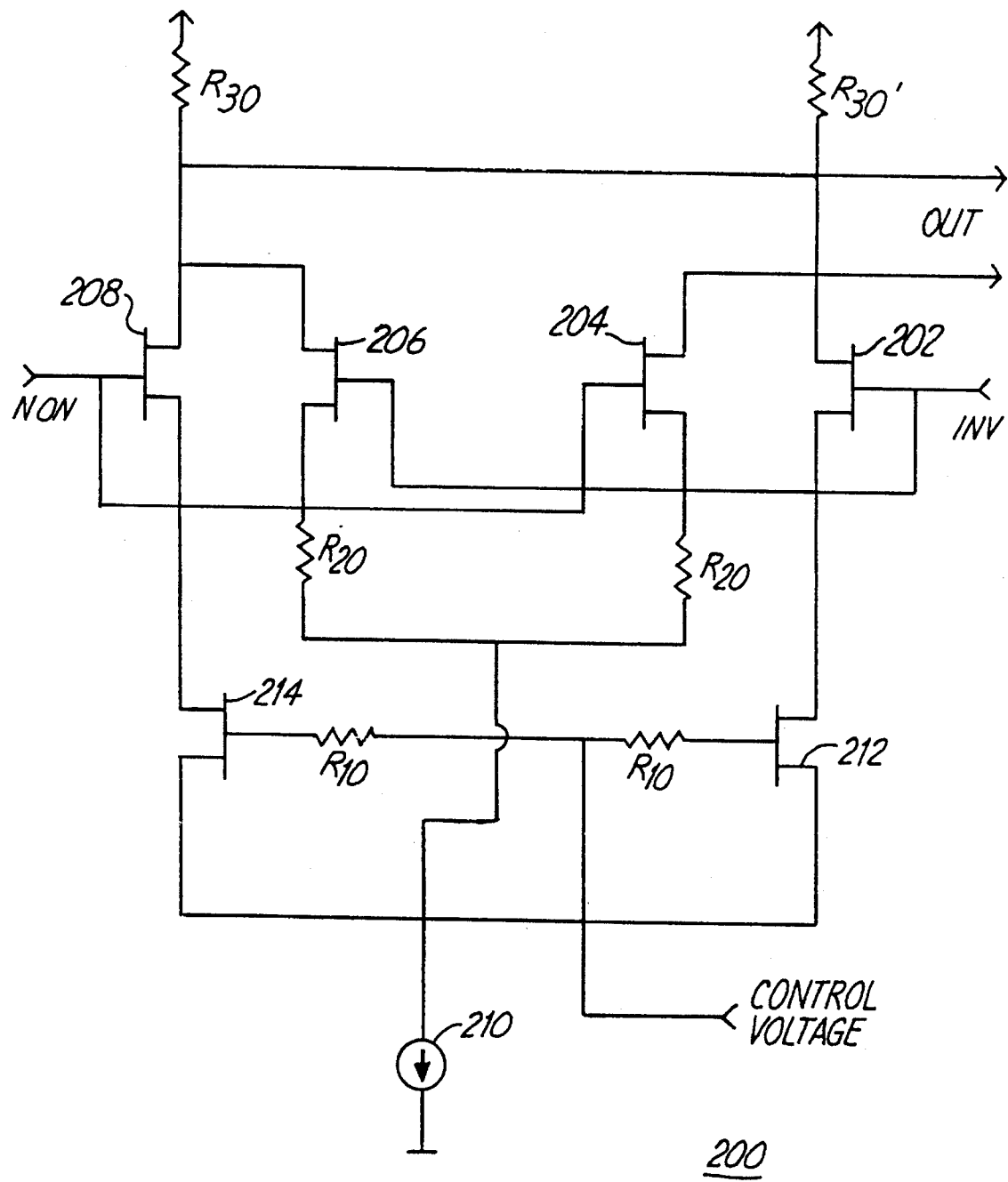
FIG. 2 is a schematic diagram of a differential amplifier circuit, according to one embodiment of the present invention.

FIG. 2 illustrates one embodiment of the teachings of the present invention. An AGC differential amplifier 200 is shown having a first pair of transistors 202, 208 and a second pair of transistors 204, 206 electrically coupled to a common current source 210. The output signals of the two pairs of differential transistors are provided at the drained-coupled terminals of each pair of transistors. A pair of balanced load resistors, $R_{30}$, are coupled at the drain electrodes of the paired gain transistors 202, 208 and 204, 206. A pair of resistors $R_{10}$ are disposed between the gate electrodes of the transistors 212, 214 to provide circuit stability.

In operation, the invention of FIG. 2 adds an inverted signal INV, to the gate electrodes of the transistors 202, 206. The inclusion of a relatively small inverted signal creates a negligible impact on the maximum gain of the amplifier 200. As the amplifier 200 attenuates, the inverted signal INV becomes a more significant ratio of the total gain. This produces the desired effect of extending the range of the amplifier 200 by making the attenuation level of the amplifier larger.

The transistors 204, 206 are driven at their gate electrodes from the opposite differential signal, having a small amount of gain, reflective of resistor $R_{20}$. Since the transistors 208, 206 share a common load resistor $R_{30}$, their gain is summed on resistor $R_{30}$ (a similar process occurs for transistors 202, 204 with regard to resistor $R_{30}'$). Attenuation in amplifier 200 occurs as transistors 204, 206 are driven by the opposite input signal of the differential pair 208, 206; such signal being 180° out-of-phase with the input signal. As the gain of transistor pair 202, 208 decreases, the out-of-phase signal from the transistor pair 204, 206 is summed to further diminish the gain.

The differential amplifier described in FIG. 2 may be constructed utilizing any appropriate well-known monolithic integrated circuit manufacturing process. The transistors 202–208 are shown to be field-effect-transistors (FET) type, although design choice alternative components, may dictate while retaining the benefit of the teaching of the present disclosure.

Alternatively, the resistors R20 may be replaced with a controllable FET of similar capacity to the transistors 212 and 214, with the control voltage set to provide maximum attenuation to the pair of gain transistors 204, 206. In yet another alternative, the load resistors $R_{30}$ could be replaced with active load devices such as a current source or transistor.

Figure 3:
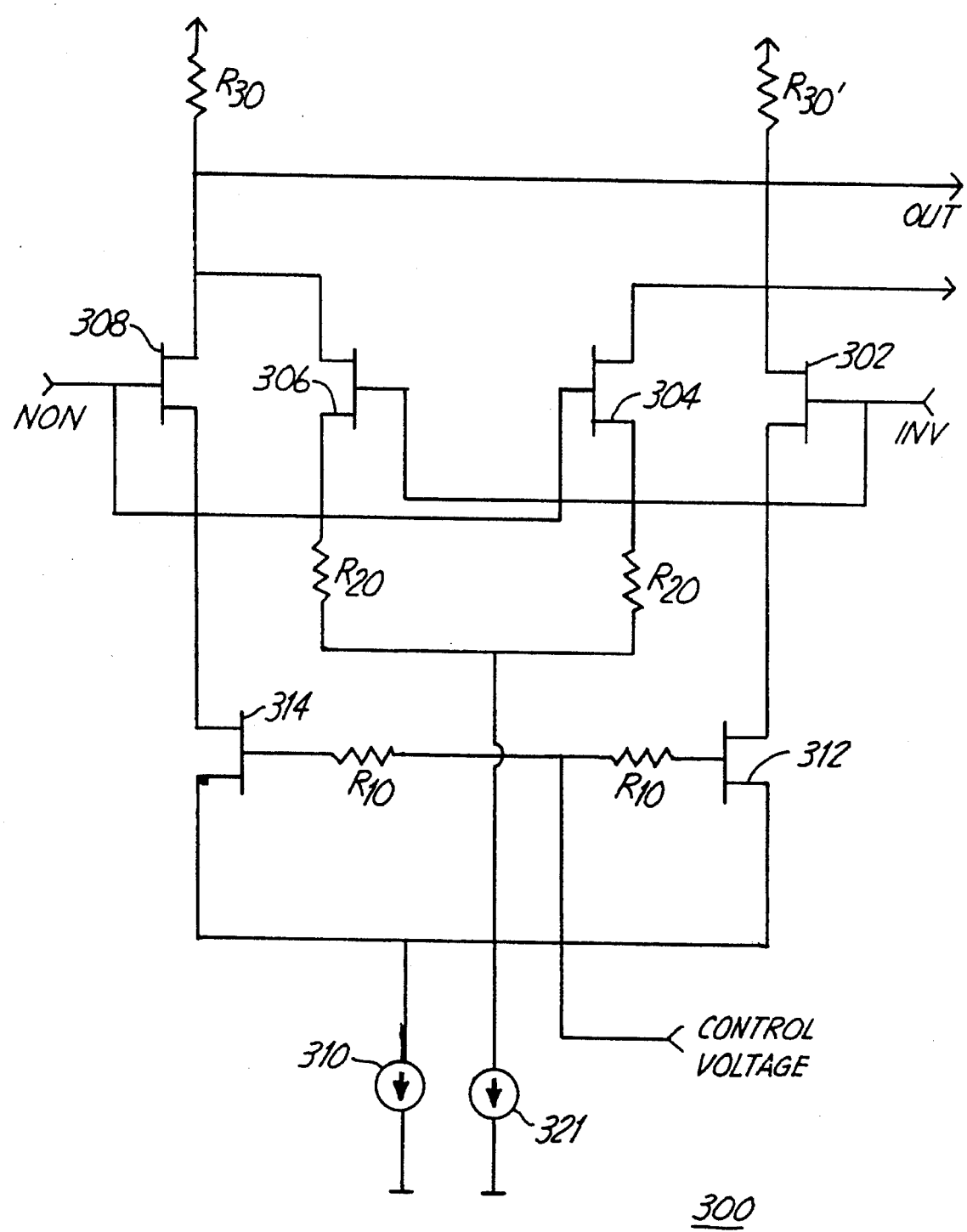
FIG. 3 is a schematic diagram of an alternate differential amplifier circuit of the present invention.

FIG. 3 illustrates an alternate embodiment of the amplifier of FIG. 2. A second current source 321, is shown (in addition to current source 310) coupled to the differential transistor pairs 302, 308 and 304, 306 of amplifiers. Operationally, the working of the amplifier 300 is similar to the device described in FIG. 2. The injected inverted signal INV is coupled to the gate of transistors 302, 306, having a negligible amount of gain, while producing the desired effect of extending the range of amplifier 300.

Those skilled in the art will readily recognize that various modifications and changes may be made to the present invention without departing from the true spirit and scope thereof, which is set forth in the following claims.

I claim:

1. A differential amplifier circuit comprising:

a first pair of transistors, each coupled to a first common driving signal at their gate electrode;

a second pair of transistors, each coupled to a second common driving signal at their gate electrode;

a plurality of current sources coupled to each pair of transistors via a source electrode of each transistor;

a pair of input transistors electrically coupled in parallel between the plurality of current sources and a source electrode of a transistor from the first and second pair of transistors; and a pair of resistors coupled in series between the first and second input transistors for circuit stability;

wherein a drain electrode of a first transistor from the first pair of transistors is coupled in common to a drain electrode of a first transistor from the second pair of transistors, and the drain electrodes of the second transistors from the first and second pair of transistors are coupled in common, thereby establishing an output signal of said circuit obtained across the paired drain electrodes of the first and second pair of transistors; and wherein the second driving signal is an inverted signal of the first driving signal and thereby extends the differential amplifier circuit range by increasing the attenuation level of the circuit.

2. The apparatus of claim 1, further comprising a second pair of resistors coupled in parallel between the plurality current sources and one of the transistors from the first and second pair of transistors.

\* \* \* \* \*